(12) United States Patent
Tsironis (10) Patent No.: US 10,520,541 B1
(45) Date of Patent: Dec. 31, 2019

(54) HYBRID ELECTRONIC TUNER

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 245 days.

(21) Appl. No.: 15/788,430

(22) Filed: Oct. 19, 2017

Related U.S. Application Data (60) Provisional application No. 62/411,179, filed on Oct. 21, 2016.

(51) Int. Cl.
| | | |
|---|---|---|
| H03H 7/38 | (2006.01) | |
| G01R 31/26 | (2014.01) | |
| G01R 31/28 | (2006.01) | |
| H03H 7/40 | (2006.01) | |

(52) U.S. Cl.
CPC ..... *G01R 31/2621* (2013.01); *G01R 31/2822* (2013.01); *H03H 7/40* (2013.01)

(58) Field of Classification Search
CPC ........ H03H 7/40; H03H 7/38; H04L 25/0278; G01R 31/2621; G01R 31/2632; G01R 31/2614; G01R 31/2822
USPC ............ 333/17.3, 263, 32, 33; 324/637, 641
See application file for complete search history.

(56) References Cited

U.S. PATENT DOCUMENTS

| | | |
|---|---|---|
| 5,034,708 A | 7/1991 | Adamian et al. |
| 9,331,670 B1 | 5/2016 | Essing |
| 9,716,303 B1 | 7/2017 | Tsironis |
| 10,317,445 B1 * | 6/2019 | Tsironis ................. G01R 27/28 |
| 10,345,370 B1 * | 7/2019 | Tsironis ............. G01R 31/2614 |
| 10,348,273 B1 * | 7/2019 | Tsironis ................... H03H 7/40 |

OTHER PUBLICATIONS

"Load Pull for Power Devices" [online], [Retrieved on Mar. 14, 2017], Retrieved from Internet <URL: http://www.micorwaves101.com/encyclopedia/loadpull.cfm>.
"Computer Controlled Microwave Tuner—CCMT", Product Note 41, Focus Microwaves, Jan. 1998.
"PIN Diode" [online], [Retreived on Oct. 16, 2017]. Retrieved fom Internet <URL: https://en.wikipedia.org/wiki/PIN_diode>.
"MOSFET" [online], [Retrieved on Oct. 16, 2017], Retrieved from Internet <URL: https://en.wikipedia.org/wiki/MOSFET>.
Rohde & Schwarz ZVA Vector Network Analyzer, [online], [Retrieved Sep. 2, 2016], Retrieved from Intnet <URL: http://www.rohde-schwarz.com/en/product/zva-productstartpage_63493-9660.html>.

* cited by examiner

Primary Examiner — Stephen E. Jones (57) ABSTRACT

A hybrid RF electronic impedance tuner is made using multiple PIN diodes or MOSFETs mounted in a low loss slabline, between the bottom surface of the center conductor and ground. The diodes and FETs are DC controlled individually and spaced appropriately along the slabline for maximum Gamma and bandwidth. The electronic tuner is combined with a feed forward active loop using an adjustable wave-probe coupler and a fixed coupler or circulator to enhance the reflected signal towards the DUT. As a result, reflection factor up to 1 at DUT reference plane is reached, combined with the high tuning speed of the electronic tuner.

14 Claims, 12 Drawing Sheets

HYBRID ELECTRONIC TUNER

PRIORITY CLAIM

This application claims priority on provisional application 62/411,179, titled "Hybrid Electronic Tuner", filed on Oct. 21, 2016.

CROSS-REFERENCE TO RELATED ARTICLES

1. "Load Pull for Power Devices" [online], [Retrieved on 2017 Mar. 14], Retrieved from Internet <URL: http://www.micorwaves101.com/encyclopedia/loadpull-.cfm>.
2. "Computer Controlled Microwave Tuner—CCMT", Product Note 41, Focus Microwaves, January 1998.
3. ADAMIAN et al., U.S. Pat. No. 5,034,708, "Programmable Broadband Electronic Tuner".
4. "PIN Diode" [online], [Retreived on 2017 Oct. 16]. Retrieved fom Internet <URL: https://en.wikipedia.org/wiki/PIN_diode>
5. "MOSFET" [online], [Retrieved on 2017 Oct. 16], Retrieved from Internet <URL: https://en.wikipedia.org/wiki/MOSFET>.
6. JACOBUS A. J. Essing, U.S. Pat. No. 9,331,670, "Gamma Boosting Unit (GBU) for Hybrid Load and Source Pull".
7. Rohde & Schwarz ZVA Vector Network Analyzer, [online], [Retrieved 2016-09-02], Retrieved from Intnet <URL: http://www.rohde-schwarz.com/en/product/zva-productstartpage_63493-9660.html>.
8. TSIRONIS, C., U.S. Pat. No. 9,716,303, "Low cost probes for slide screw tuners", FIGS. 5A, 12 and 13.

BACKGROUND OF THE INVENTION—PRIOR ART

Figure 1:
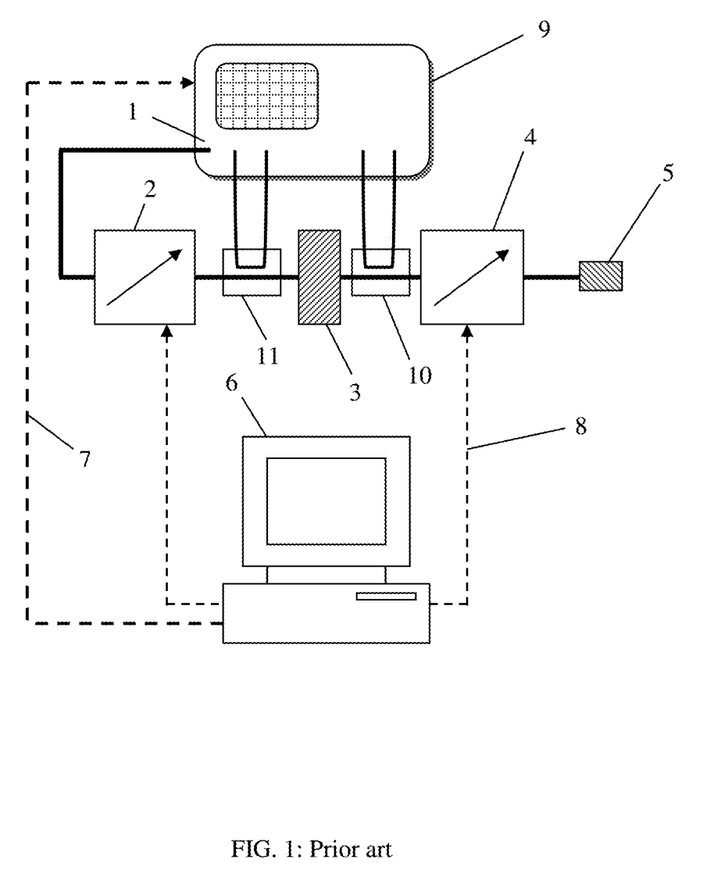
FIG. 1 depicts prior art, automated load pull test setup using live injected and reflected power wave measurement.

This invention relates to high power (nonlinear) testing of radio frequency (RF) transistors (DUT) in the frequency and time domain using Load Pull (see ref. 1). Load pull is the method by which the load impedance presented to the DUT at a given frequency is changed systematically (tuned) and the DUT performance is registered, with the objective to find an optimum tuning condition for certain overall performance objectives. The objectives may be maximum power, maximum efficiency, linearity or else or a combination thereof. The same is valid for the source side of the DUT. Passive (slide screw) tuners (see ref. 2) are used to create the various impedances presented to the DUT for frequencies above 100 MHz. A typical test setup is shown in FIG. 1: a signal source (1), in this case the source is internal to the vector network analyzer (VNA), (9), injects RF power into a DUT (3) via an input tuner (2) which synthesizes the source impedance presented to the DUT. An output tuner (4) generates the load impedance and is terminated with the characteristic impedance Zo (5). The injected and extracted power waves are detected using bidirectional couplers (10, 11) and measured by the receiver (9). Typical receivers are Vector Network Analyzers (VNA), see ref. 7. Such receivers can both (a) generate signal (1) and (b) detect harmonic signal components through the couplers (10, 11), in which case a reverse Fourier transformation allows creating the real time dependence of a non-sinusoidal signal entering and/or leaving the DUT. In case of an active or hybrid tuner, which cannot be fully and permanently and accurately calibrated, because of nonlinear behavior of the used feedback amplifiers, which may change during tuning, this test setup, instead of a simpler setup using only input and output power meters, is mandatory, because it also allows measuring "live" the source and load impedances presented to the DUT. The entire setup is controlled by a PC (6) via digital communication (7) with the test instruments (9) and the tuners (8). Data are collected by the PC as a function of the impedances generated by the tuners and saved in load pull measurement files.

Figure 2:
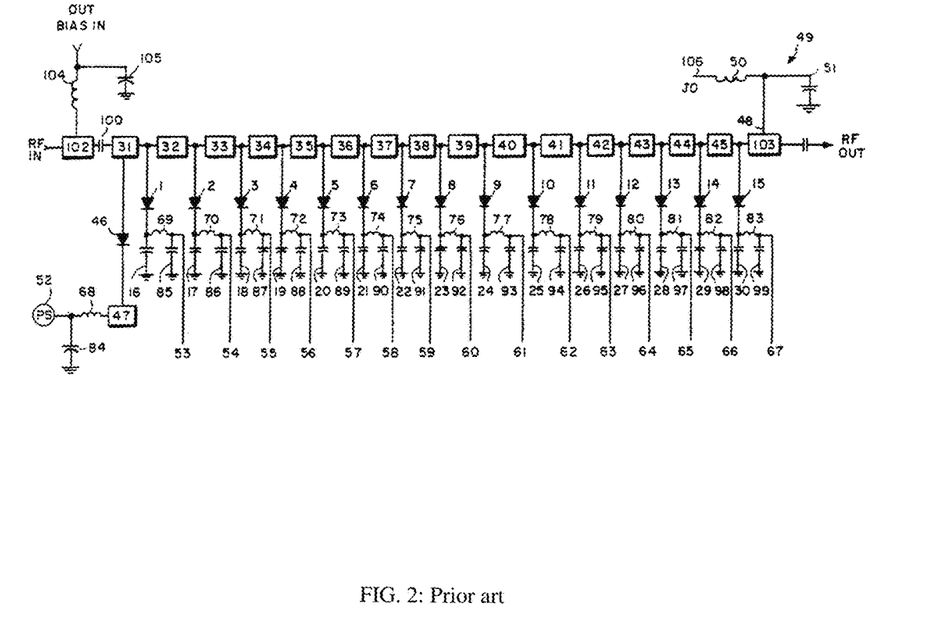
FIG. 2 depicts prior art, electronic tuner using PIN diodes and microstrip lines (U.S. Pat. No. 5,034,708), none of the item numbers in the figure are referred to in the specification.
Figure 3:
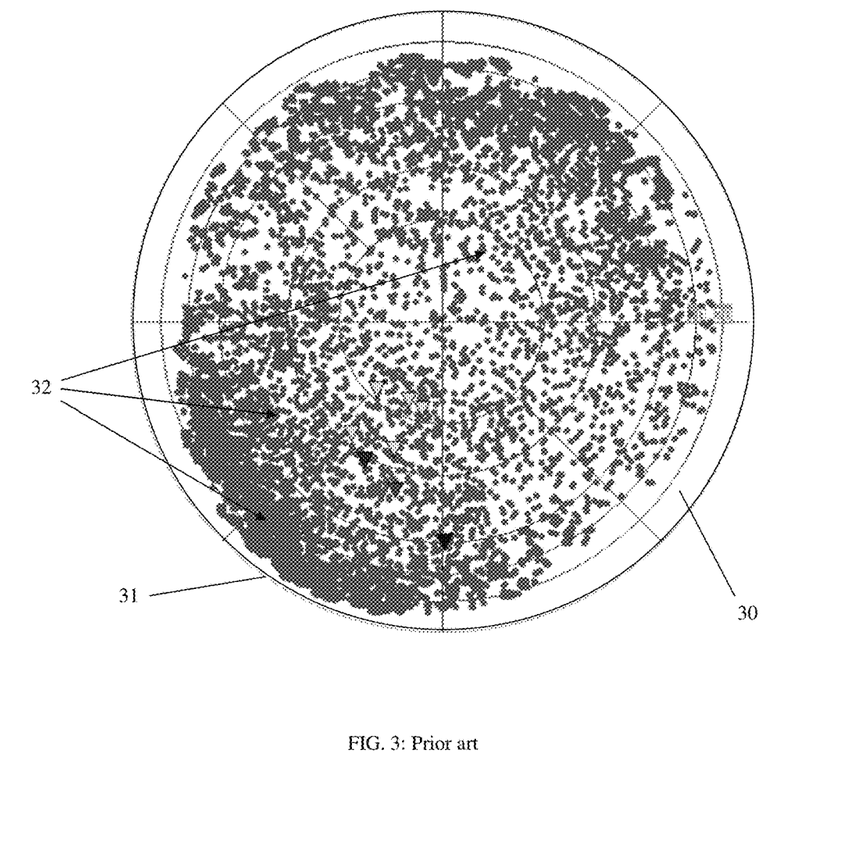
FIG. 3 depicts prior art, calibration and tunable points and overall tuning range of electronic tuner (U.S. Pat. No. 5,034,708).

Impedance tuners are used to create the test impedances used in load and source pull testing. Some tuners use the slide-screw principle, (see ref. 2) or electronic components, such as PIN diodes (2), see ref. 3 and 4. In this case an array of electronic switches (PIN diodes), distributed along a transmission line (micro-strip as per ref. 3), when switched ON and OFF alternatively, in various permutations, creates a multitude of reflection factors covering a large portion of the Smith chart over a certain frequency range. By placing the diodes strategically spaced along the transmission line (see ref. 3, FIG. 1, column 4 lines 47 ff. and column 5, lines 1 to 22), the combination of the individual reflection factors can generate tuning patterns (i.e. the complete cloud of points (32)) on the Smith chart (31) as shown in FIG. 3 (see ref. 3). The regularity and density of electronically tuned points depends on the number of diodes used, whereas the limitation in maximum reflection (uncovered area (30)) is due to losses associated with the used prior art micro-strip structures and diode losses. In total $2^N$ different reflection factors, corresponding to the possible tuner states can be generated, whereby N is the number of diodes.

BRIEF SUMMARY OF THE INVENTION

Figure 4:
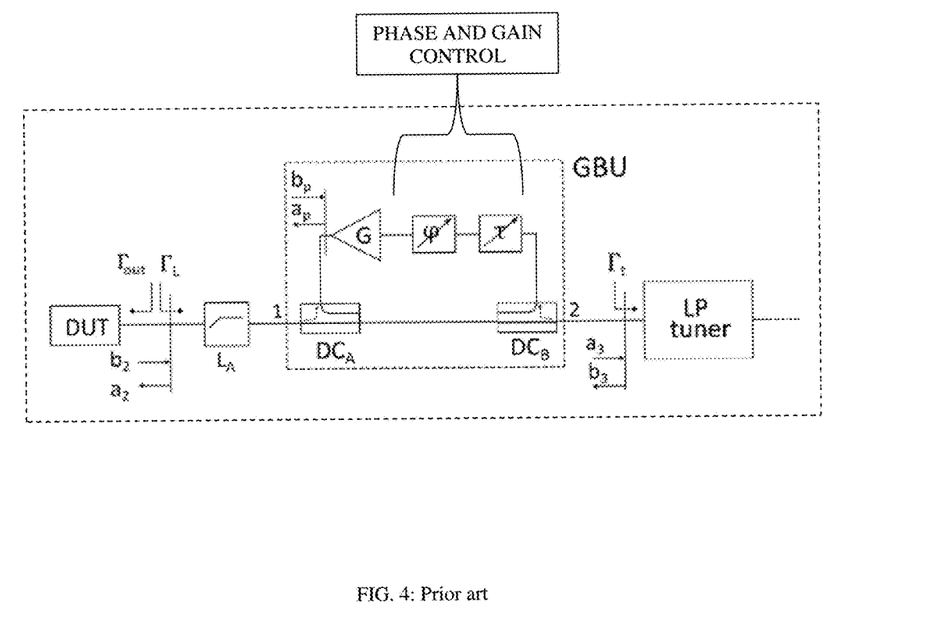
FIG. 4 depicts prior art, feed forward active injection network (Gamma Boosting Unit) (U.S. Pat. No. 9,331,670).

In this invention a hybrid solution between traditional electronic tuner based on microstrip transmission line and active feed forward signal injection is disclosed. The active feed forward component, of which the concept is shown in FIG. 4, samples a small portion of the signal leaving the output port of the DUT using a directional coupler (wave-probe, see ref. 6), which, in this invention is adjustable, amplifies the signal and injects it back into the DUT after adjusting its amplitude and phase in order to be vector-added to the main signal reflected back into the DUT by the electronic tuner. The complex amplitude and phase adjustment of the sampled signal is controlled by the adjustable wave-probe coupler (FIGS. 5 to 8). Mounting the wave-probe on the vertical axis of a prior art slide screw tuner (see ref. 2) allows for a simple amplitude and phase control, by adjusting the coupling between the coupler and the center conductor, effectuated by just setting the penetration depth of the wave-probe into the slabline slot; and adjusting the phase by moving the carriage (59) along the slabline. The amplified signal is injected back into the DUT using a coupler (51) or a circulator (73).

BRIEF DESCRIPTION OF THE DRAWINGS

The invention and its mode of operation will be better understood from the following detailed description when read with the appended drawings in which:

FIG. 6A through 6B depict second embodiment of hybrid electronic tuner.

DETAILED DESCRIPTION OF THE INVENTION

The invention discloses a high speed, high reflection hybrid (active+passive) electronic impedance tuner. The concept is shown in a number of embodiments in FIGS. 5 to 10. The basic idea is to use the low loss slotted airline (slabline) of a slide screw tuner and implant electronic switches (56) in form of PIN diode (see ref. 4) or MOSFET transistor (see ref. 5) switches in the area below the center conductor (511) thus affecting minimally the electric field when the switches are in the OFF (open) state and creating a short circuit when they are in the ON (shorted) state. The use of the slabline (511, 508) as transmission line, beyond having very low insertion loss, also allows integrating with the electronic tuner an adjustable directional coupler (502) (wave-probe); the wave-probe samples a portion (68) of the signal to be amplified and injected back (63) into the slabline in direction of the DUT, thus enhancing the amplitude of the reflection factor (64) generated by the electronic tuner itself, thus presenting to the DUT reflection factors up to the value of 1 and above, allowing power matching transistors with internal output impedance close to 0Ω The concept is outlined in detail below. The slabline in this embodiment does not need to have the same sturdy metallic walls, as in traditional impedance tuners (see ref. 2 and 8); in traditional tuners the slabline must have solid full metal side-walls, since the tuning probes make rubbing galvanic contact (see ref. 8). In the present embodiment the components used (wave-probe and PIN diodes/MOSFETS) do not touch the side-walls. It is therefore sufficient that the side-walls be electrically conductive, which can be made also using cheaper metallized plastic material.

Figure 5:
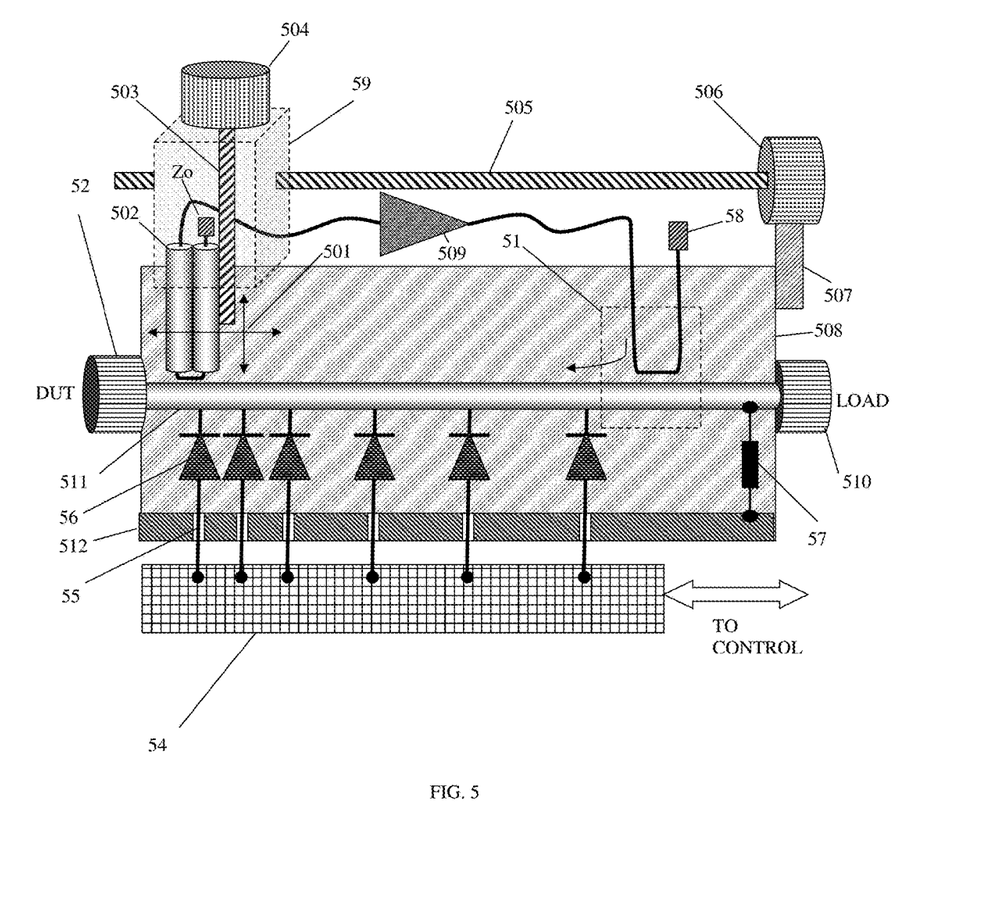
FIG. 5 depicts first embodiment of hybrid (active-passive) electronic tuner using PIN diodes.
Figure 6A:
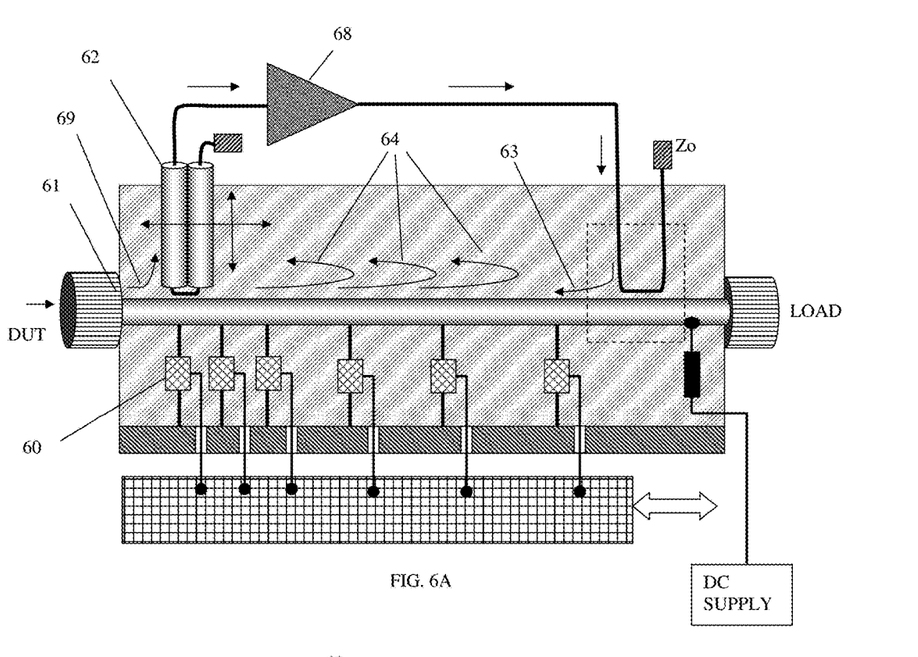
FIG. 6A depicts overall view using MOSFET (see ref. 5) electronic switches.
Figure 7:
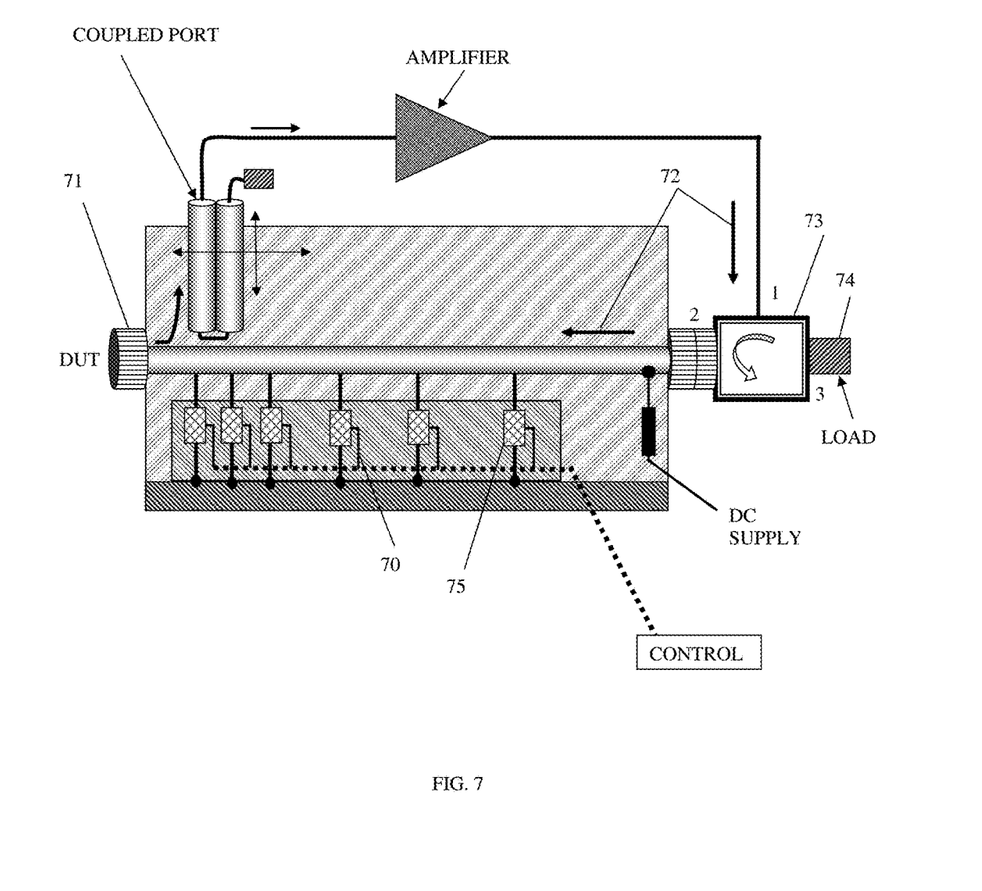
FIG. 7 depicts third embodiment of hybrid electronic tuner, using circulator for signal feedback injection.
Figure 8:
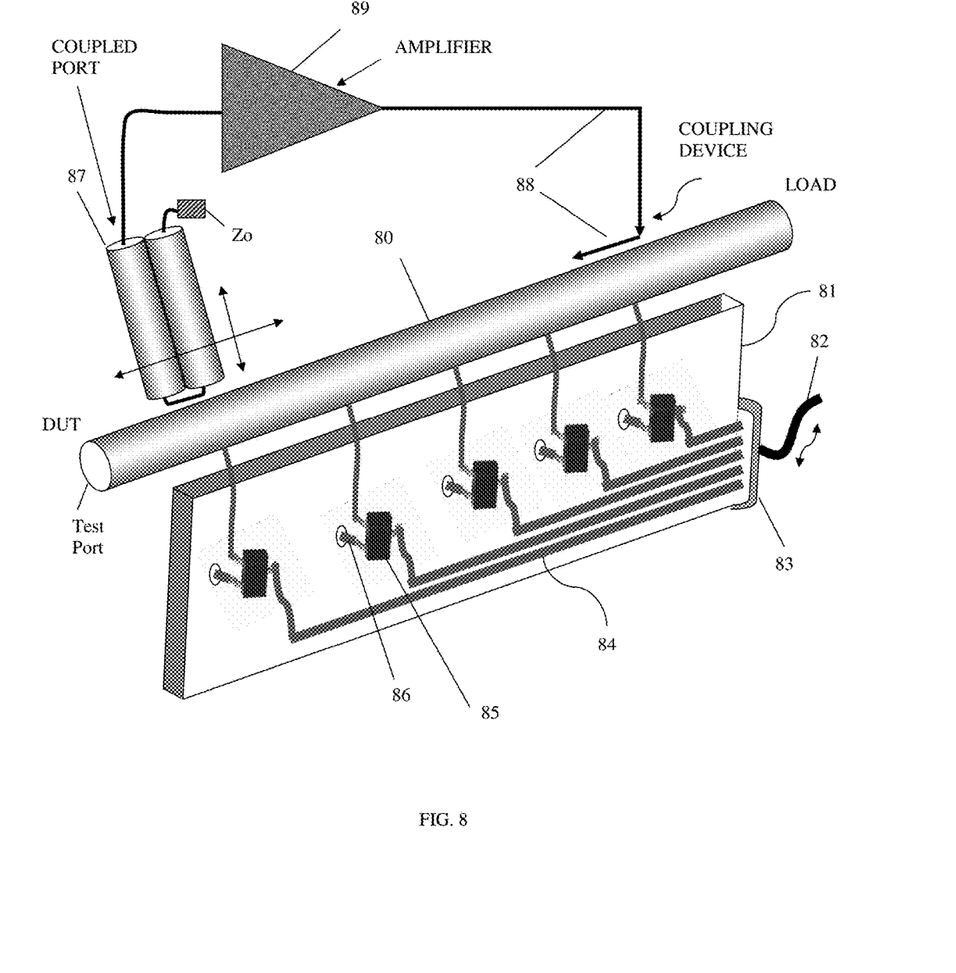
FIG. 8 depicts a 3D view of the core parts of the hybrid electronic tuner of FIG. 7.
Figure 9:
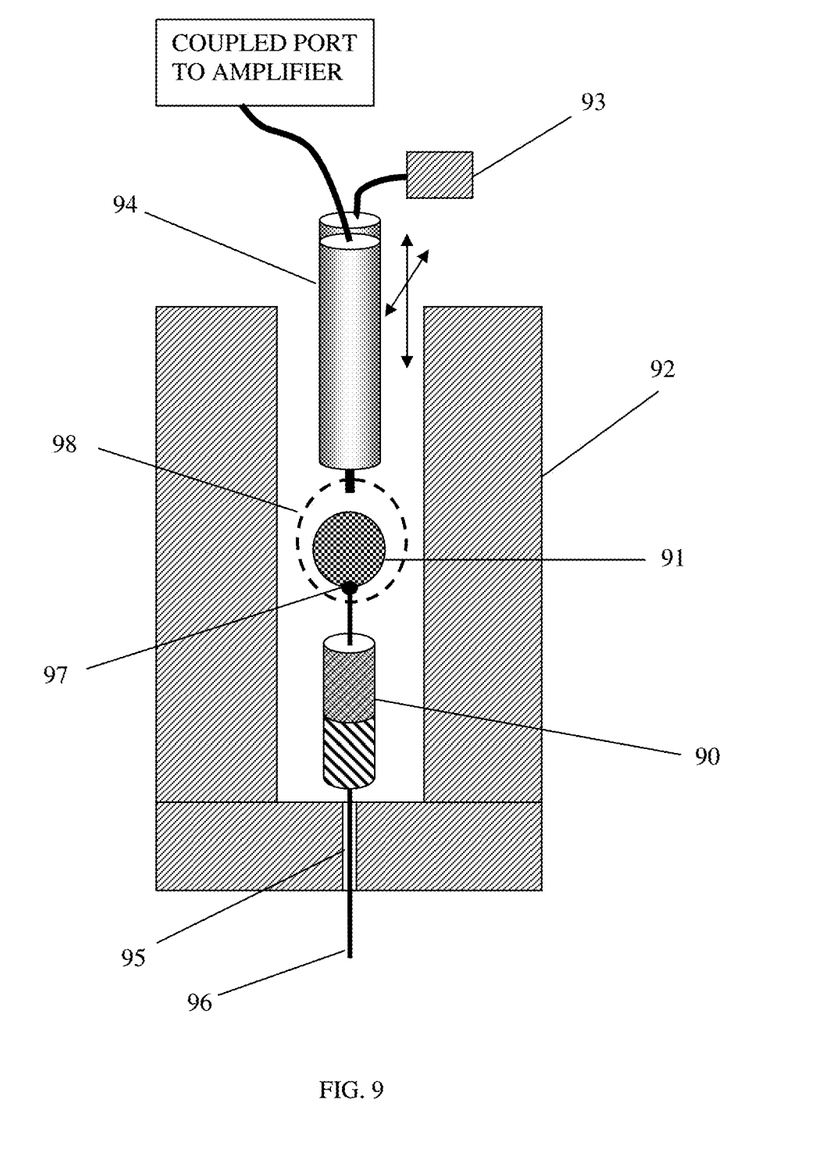
FIG. 9 depicts cross section of slabline with PIN diodes and installed wave-probe.

FIGS. 5, 8, 9 and 10 show the concept of integrating and mounting the electronic switches (PIN diodes in FIGS. 5 and 9, and MOSFETS in FIGS. 6, 7, 8 and 10 in a slabline. The slabline has an input (test) port (52), which is attached to the DUT, an idle port (510), a center conductor (511) and grounded side walls (508) and a grounded bottom wall (512). An array of several electronic switches, shown here as PIN diodes (56) are connected (soldered) (97) on the bottom of the center conductor (FIG. 9) and RF grounded capacitively (95, 55) using feed-through capacitors and controlled using a switch control matrix (54). The reason for capacitive feed-through grounding is that the diodes must be individually DC biased into ON or OFF states. The RF grounded bottom terminal of the diodes (55) is connected to a PCB (printed circuit board) control board (54), which controls the DC bias of each electronic switch individually (82) (FIG. 8). The center conductor (511) must be set at a given DC potential through a low pass filter (inductor) or bias tee (57) in order for control to have a switch ON or OFF effect. The PC board (54) is controlled via digital communication (82) from the PC controller.

The signal entering the test port (52) is sampled by the coupled port (502) of the wave-probe and fed into the power amplifier (509). The isolated port of the wave-probe is terminated with the characteristic impedance Zo. The wave-probe is mounted on the vertical axis (503) of the mobile carriage (59) which control the penetration (501) of the wave-probe into the slot of the slabline (FIG. 9). The vertical axis is controlled by a vertical stepper motor (504). The carriage (59) is moved horizontally (501) along the slabline using and acme lead screw (505) and horizontal stepper motor (506), which is mounted permanently (507) on the slabline body (508). The amplified signal is injected back into the slabline using a coupling device (51), shown here as a directional coupler, of which the isolated port is also terminated with Zo (58).

Figure 6B:
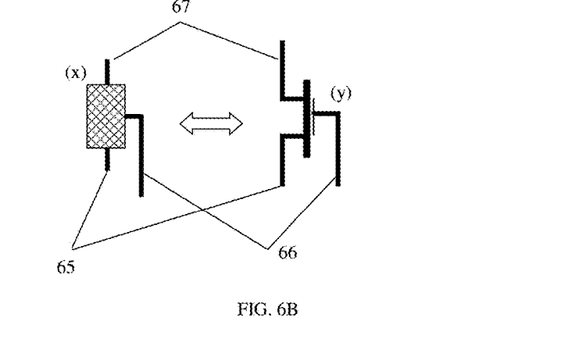
FIG. 6B depicts actual MOSFET configuration and control terminals.

FIG. 6A shows a second embodiment, whereby instead of PIN diodes MOSFET transistors (60) are used. The drain terminal (67) of the MOSFETs is connected to the bottom of the center conductor (80) and the source terminal (65) is grounded. The control terminal (gate, 66) is connected to control, which can switch the MOSFET between ON (drain to source resistance ≈0) and OFF (drain to source resistance ≈∞). The signal entering into the test port (61) is sampled (69) by the coupled port (62) of the wave-probe and injected into the amplifier (68) and then back into the center conductor (63) of the slabline, where it is combined with the signal reflected at the MOSFET switches (64). The equivalent electric circuit to a MOSFET switch is shown in FIG. 6B: on the left side we show a symbolic presentation and on the right side the official MOSFET symbol: the drain terminal (67) is connected to the bottom of the center conductor (97), FIG. 9, the source terminal (65) is capacitively RF grounded (95). Alternatively the source (65) can be DC and RF grounded (101), FIG. 10, whereby the drain is connected to the center conductor and biased to a floating DC potential. MOSFET control is through the gate terminal (66).

A third embodiment of the invention is shown in FIG. 7: The signal entering at the test port (71) is sampled and amplified as in the embodiment of FIG. 5, but, instead of being injected back into the slabline using the coupling device (51), shown here as a directional coupler, it is injected (72) using a circulator (73). The circulator is terminated at its port 3 by the characteristic impedance Zo (50Ω). The signal entering port 1 of the circulator is transferred with negligible loss to port 2 and any reflected power at the electronic tuning switches (75) or at the test port (71) is absorbed by Zo at port 3 and Zo (74), thus not going back into port 1 and the power amplifier. The MOSFET switches (75) are controlled through their gate terminals (70). The MOSFETs (75) can also be replaced by PIN diodes or voltage controlled variable capacitors (Varactors). This embodiment bears the advantage that the feed-back power injected is higher than using a directional coupler, because an appropriate coupler has at least 6 dB coupling (or injecting back only 25% of available power of the power amplifier) whereas the circulators yield more than 95% of the returned power. The only shortcoming of this embodiment is that circulators have limited bandwidth, typical one octave (Fmax/Fmin=2, whereas 6 dB couplers can cover more than one frequency decade (Fmax/Fmin=10). If power is less important than bandwidth (as in the case of testing low power devices) couplers is the best solution (embodiments 1 and 2). Otherwise one should use circulators (embodiment 3).

FIG. 8 is a visualization of the core items of the tuner using MOSFET switches (85). The switches are mounted on a PC board (81) and individually controlled through bias lines (84). Their source terminal is grounded using via holes (86, 102) to the grounded back surface of the PC board (101). The drain terminals are connected to the center conductor (80, 105). The control line assembly is connected (82) to the controller using a multi-pin connector (83), which is controlled numerically using a switch matrix comprising high speed analog/digital converters (A/D converter). The wave-probe (87) samples the signal coming into the test port and injects it into the amplifier (89) which amplifies it and injects it (88) back into the line (80) using the coupler (FIGS. 5 and 6), or the circulator (FIG. 7). Changing the penetration of the wave probe and its horizontal position controls the magnitude and the phase of the re-injected signal, which overlaps with the reflected signal at the MOSFET switches and increases the reflection factor at the test port.

Figure 10:
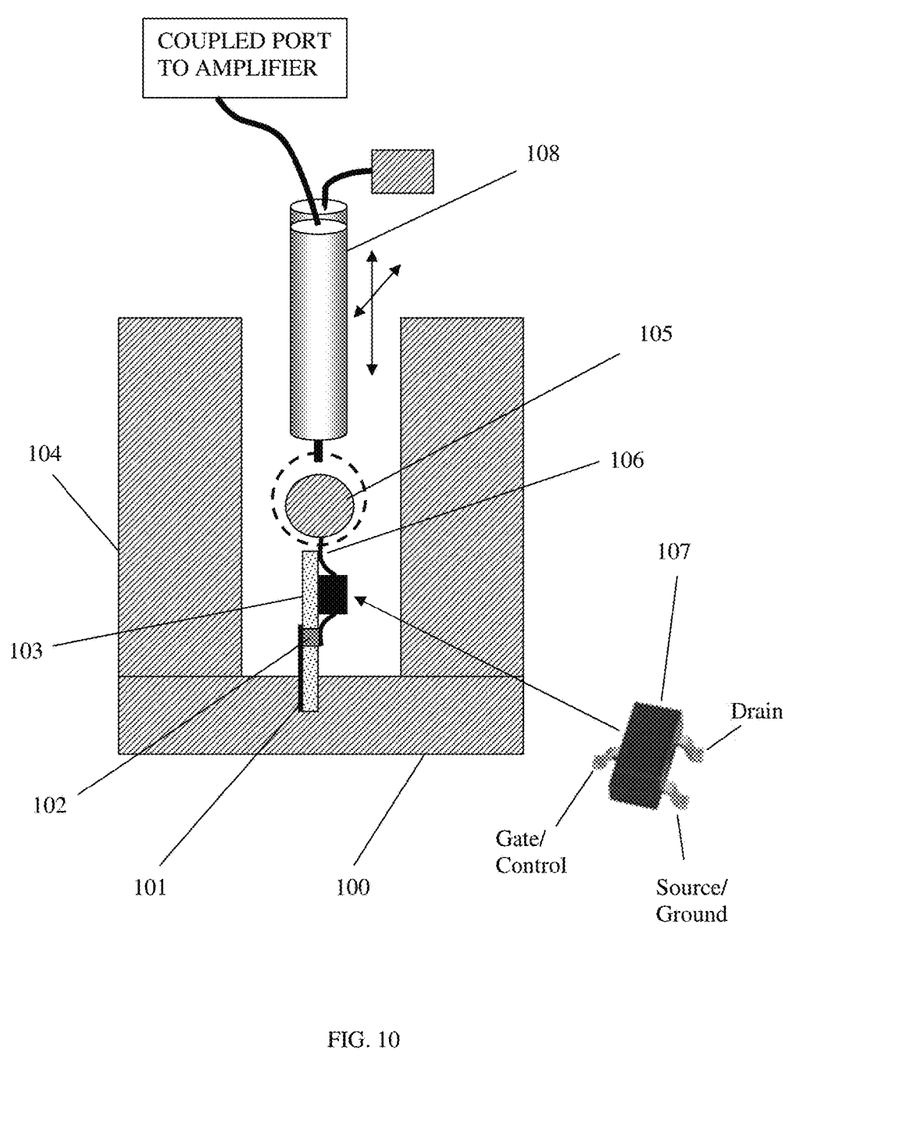
FIG. 10 depicts cross section of slabline, PC board carrying MOSFET electronic switches and installed wave-probe.

FIGS. 9 and 10 show possible assembly techniques of PIN diodes and MOSFET switches in the hybrid electronic tuner. Wave probe (94), FIG. 9, penetrates into the slabline (92) and samples through magnetic coupling (98) the incoming signal travelling on the center conductor (91). The isolated port is terminated with Zo (93). The PIN diode (90) is connected capacitively between RF ground (95) and the bottom (97) of the center conductor (91). The DC isolated cathode (96) of the diode is biased to ON and OFF states. Varactors are mounted and biased using the same method. In the case of MOSFET switches (107) they can be mounted on PC boards (103) and their drain terminals (106) can be connected to the underside of the center conductor (105) as well. Their source terminals are RF and DC grounded using via holes (102) to the conducting back surface of the PC board (101) and the bottom wall (100) of the slabline (104). The wave-probe (108) performs the same functions as before (FIG. 9).

Figure 11:
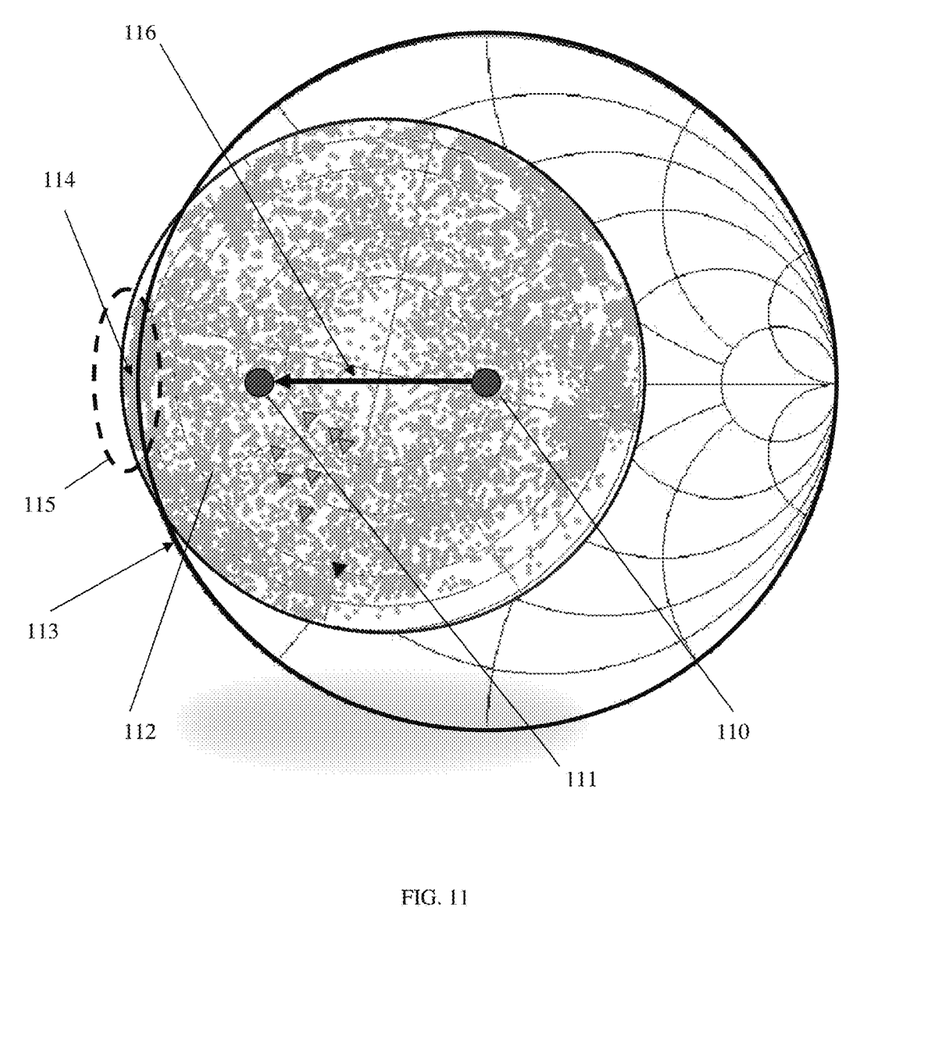
FIG. 11 depicts measured tuning points of hybrid electronic tuner allowing reflection factors |Γ|>1.

The result of active injection into the electronic tuner is shown in FIG. 11. The original tuning area (112, FIG. 3) is shifted towards the desired area (small internal resistances of the DUT). The active pre-matching affect is symbolically shown by vector (116) which shifts the center of the Smith chart (110) to a new point (111), from which starting point the remaining tuning occurs. The tuning range exceeds the boundaries of the Smith chart (113) in the desired area (114) over a certain range of reflection factors (115). In general the wave-probe coupling will be automatically weakened to stop the tuning range from reaching outside the Smith chart, because many DUT's may fail if presented with |Γ|>1 or R.tuner<0Ω.

Figure 12:
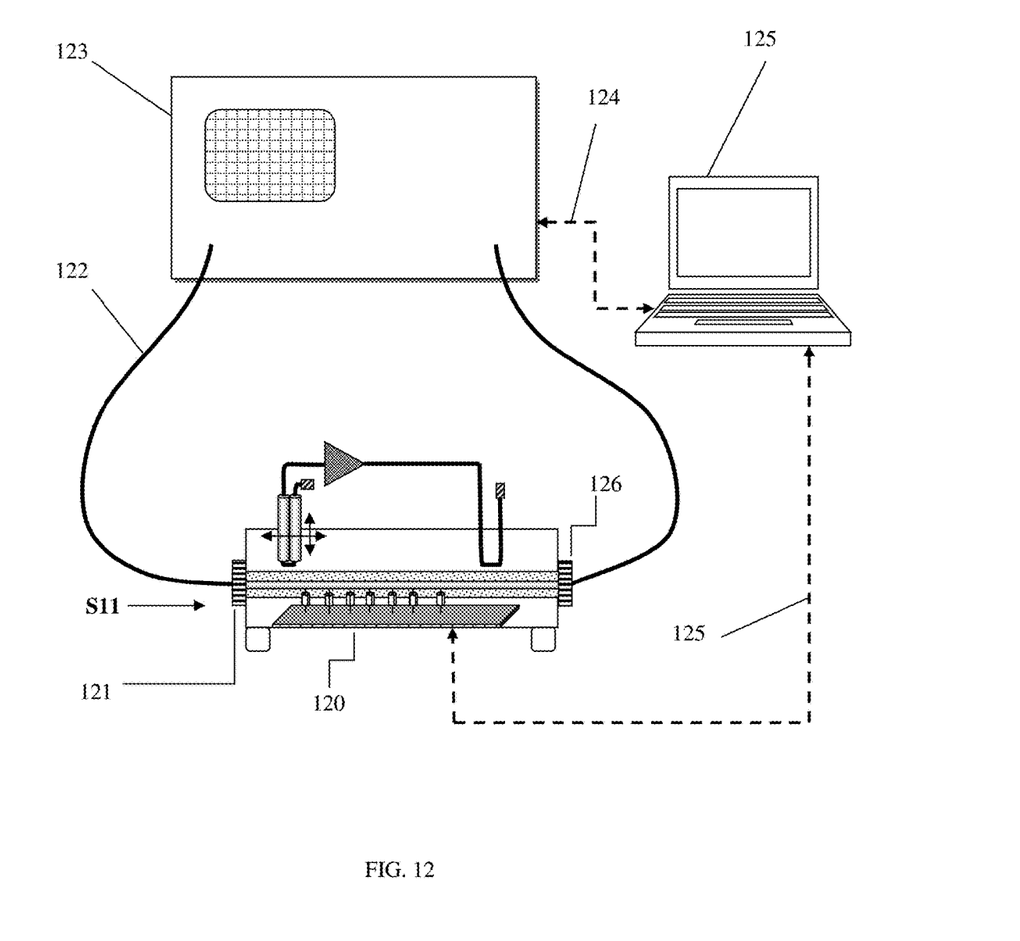
FIG. 12 depicts calibration setup for hybrid electronic tuner.

FIG. 12 shows a pre-calibration setup for hybrid electronic tuners. A vector network analyzer VNA (123) measures s-parameters of the electronic tuner between the test (121) and idle (126) ports using high quality RF cables (122). S-parameters are measured for all electronic RF switch permutations and saved. The VNA and tuner (120) are controlled by a system controller (125) which communicates digitally with the VNA (124) and the tuner (125). In this procedure the wave-probe is withdrawn, since the active injection cannot be really calibrated. If it would be calibrated this would be at the very low power used by the VNA, but in real operation, at higher power, the gain and phase of the feedback amplifier would change and this would invalidate the calibration data. The pre-calibration is useful mostly if the electronic tuner is used to tune close to 50Ω, where the active loop is not used. In real high power operation close to the edge of the Smith chart the active loop is switched on and the actually presented impedances and power flows are measured "in situ" by the couplers (10) and (11) as shown in FIG. 1.

The invention has been described in a preferred number of embodiments. No obvious alternative shall impede on its originality and validity.

What I claim is:

1. A hybrid (active/passive) impedance tuner comprising
   (a) electronic impedance tuner, and
   (b) active injection module;
   whereby
   the electronic impedance tuner comprises a slotted airline (slabline) having an input (test) port and an output (idle) port, a center conductor between the ports and grounded conductive side-walls;
   and a multitude of remotely controlled electronic switches mounted along the center conductor of the slabline between the test and idle ports;
   whereby the electronic switches are strategically spaced along the center conductor and connected between the bottom of the center conductor and ground and are controlled by a tuner controller comprising an electronic control board, a switch control matrix and appropriate firmware;
   and whereby
   the active injection module comprises an adjustable directional coupler (wave-probe), an amplifier having input and output port and a feedback coupling device having input and output port;
   whereby the wave-probe is coupled into the slabline before the electronic impedance tuner and extracts signal power, which is amplified and re-injected into the slabline after the electronic impedance tuner via the feedback coupling device.

2. The tuner of claim 1, whereby the electronic switches are mounted strategically, at appropriate individual distance to each-other in order to obtain maximum tuning range and frequency bandwidth.

3. The tuner as in claim 1, whereby the feedback injection coupling device is a circulator having three ports, ports 1, 2 and 3, the signal flowing from port 1 to port 2, from port 2 to port 3 and from port 3 to port 1,
   and whereby the output port of the amplifier is connected to port 1, port 2 is connected to the idle port of the slabline and port 3 is terminated with the load.

4. The tuner as in claim 1, whereby the feedback injection coupling device is a directional coupler, mounted between the electronic tuner and the idle port and of which the coupled port is the input port and which injects signal towards the test port of the slabline.

5. The tuner as in claim 4, whereby the directional coupler is connected outside the tuner on the idle port.

6. The tuner as in claim 1, whereby the wave-probe is mounted on the adjustable vertical axis of a horizontally mobile carriage allowing variable penetration of the wave-probe inside the slot of the slabline and variable distance of the wave-probe from the test port.

7. The tuner as in claim 6, whereby the vertical axis and horizontal position of the carriage are stepper motor controlled from a system controller using appropriate gear and control software.

8. The tuner as in claim 6, whereby the horizontal and vertical positions of the wave-probe are manually controlled using micrometric screws and appropriate gear.

9. The tuner as in claim 6, whereby the vertical position of the wave probe is manually controlled using micrometric screw and gear, and
   whereby the horizontal position of the wave-probe is automated using stepper motors, gear and control.

10. The tuner of claim 1,
    whereby
    the coupled port of the wave-probe is connected to the input port of the amplifier,
    and
    the output port of the amplifier is connected to the input port of the feedback coupling device,
    and
    the output port of the coupling device is connected to the slabline after the electronic tuner;
    whereby the wave-probe extracts, through its coupled port, a portion of the signal power travelling along the slabline;
    and whereby the wave-probe is adjustable horizontally along the slabline and vertically into the slot of the slabline, thus allowing control of
    (i) the portion (amplitude) of signal power, which is injected into the input port of the amplifier, after being retrieved from the signal power entering into the test port,
    (ii) the phase of the retrieved signal power in step (i),
    and thus the amplitude and phase of the amplified and re-injected feedback signal power;
    and whereby the feedback injection coupling device is placed after the electronic switches, closest to or attached to the idle port.

11. The tuner as in claim 10, whereby the electronic switches are PIN diodes.

12. The tuner as in claim 10, whereby the electronic switches are MOSFET transistors.

13. The tuner as in claim 10, whereby the electronic switches are voltage controlled capacitors (Varactors).

14. The tuner as in claim 12, whereby the MOSFET transistor's drain terminal is connected to the center conductor, the source terminal is connected to ground and the gate terminal is connected to control.

\* \* \* \* \*